United States Patent
Li et al.

(10) Patent No.: US 11,764,297 B2
(45) Date of Patent: Sep. 19, 2023

(54) LDMOS WITH ENHANCED SAFE OPERATING AREA AND METHOD OF MANUFACTURE

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventors: Lianjie Li, Hsinchu (TW); Feng Han, Hsinchu (TW); Jian-Hua Lu, Hsinchu (TW); YanBin Lu, Hsinchu (TW); Shui Liang Chen, Hsinchu (TW)

(73) Assignees: TAIWAN SEMICONDUCTOR MANUFACTURING CO., LTD, Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 17/885,159

(22) Filed: Aug. 10, 2022

(65) Prior Publication Data

US 2022/0384639 A1    Dec. 1, 2022

Related U.S. Application Data

(63) Continuation of application No. 17/177,953, filed on Feb. 17, 2021, now Pat. No. 11,444,194.

(30) Foreign Application Priority Data

Nov. 4, 2020   (CN) .......................... 202011216548.1

(51) Int. Cl.
H01L 29/78       (2006.01)
H01L 29/66       (2006.01)
H01L 29/40       (2006.01)

(52) U.S. Cl.
CPC ........ *H01L 29/7816* (2013.01); *H01L 29/401* (2013.01); *H01L 29/402* (2013.01);
(Continued)

(58) Field of Classification Search
CPC . H01L 29/7816; H01L 29/404; H01L 29/402; H01L 29/66681; H01L 29/7835; H01L 29/66659
See application file for complete search history.

(56) References Cited

U.S. PATENT DOCUMENTS 7,260,442 B2   8/2007  Hwang et al.
9,256,709 B2   2/2016  Yu et al.
(Continued)

FOREIGN PATENT DOCUMENTS

CN     108847423     11/2018
CN     111755417     10/2020

OTHER PUBLICATIONS

Šeliga, Bc Ladislav. "High-Voltage Devices in Smart Power Technology." BRNO University of Technology, Oct. 2, 2014; pp. 1-57.
(Continued)

*Primary Examiner* — Joseph C. Nicely
(74) *Attorney, Agent, or Firm* — Hauptman Ham, LLP

(57) ABSTRACT

An integrated circuit comprising an n-type drift region, a gate structure directly on a first portion of the n-type drift region, a drain structure formed in a second portion of the n-type drift region, the gate structure and the drain structure being separated by a drift region length, a resist protective oxide (RPO) formed over a portion of the n-type drift region between the gate structure and the drain structure, a field plate contact providing a direct electrical connection to the resist protective oxide.

20 Claims, 14 Drawing Sheets

(52) U.S. Cl.
CPC ...... *H01L 29/404* (2013.01); *H01L 29/66681* (2013.01); *H01L 29/66689* (2013.01)

(56) References Cited

U.S. PATENT DOCUMENTS

| | | |
|---|---|---|
| 10,121,867 B2 | 11/2018 | Wu et al. |
| 11,049,938 B2 | 6/2021 | Lee |
| 11,107,917 B2 | 8/2021 | Hsu et al. |
| 2013/0119466 A1 | 5/2013 | Chung et al. |
| 2014/0040838 A1 | 2/2014 | Liu et al. |
| 2015/0278429 A1 | 10/2015 | Chang |
| 2018/0114858 A1 | 4/2018 | Chung et al. |
| 2019/0334032 A1 | 10/2019 | Ho et al. |
| 2020/0013888 A1 | 1/2020 | Su et al. |
| 2021/0028299 A1 | 1/2021 | Liu |
| 2021/0175336 A1 | 6/2021 | Lu et al. |

OTHER PUBLICATIONS

Hower, Philip L., and Sameer Pendharkar. "Short and long-term safe operating area considerations in LDMOS transistors." 2005 IEEE International Reliability Physics Symposium, 2005. Proceedings. 43rd Annual.. IEEE, 2005; pp. 1-6.

LDMOS WITH ENHANCED SAFE OPERATING AREA AND METHOD OF MANUFACTURE

RELATED APPLICATION

This application is a divisional application of U.S. patent application Ser. No. 17/177,953, filed Feb. 17, 2021, which claims the priority of China Application No. 202011216548.1 filed Nov. 4, 2020, the contents of which are incorporated herein in their entireties.

BACKGROUND

LDMOS (laterally-diffused metal-oxide semiconductor) devices are planar double-diffused MOSFET (metal-oxide-semiconductor field-effect transistor) devices commonly used in amplifiers, including microwave power amplifiers, RF (radio frequency) power amplifiers and audio power amplifiers. Fabrication of LDMOS devices tends to include a sequence of ion-implantation processes and annealing cycles in order to produce a doping profile sufficient to withstand the electric fields generated within the LDMOS devices during operation.

RF LDMOS (radio frequency LDMOS) devices are widely used in high-voltage, high-power RF power amplifier applications for frequencies ranging from 1 MHz to over 3.5 GHz and are a significant RF power device technology used in expanding and maintaining cellular infrastructure. RF LDMOS devices are widely used power amplifiers in mobile networks such as 4G and 5G cellular networks, and generally provide a desirable combination of high output power with a corresponding drain to source breakdown voltage in excess of 60V to allow their use in high voltage applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
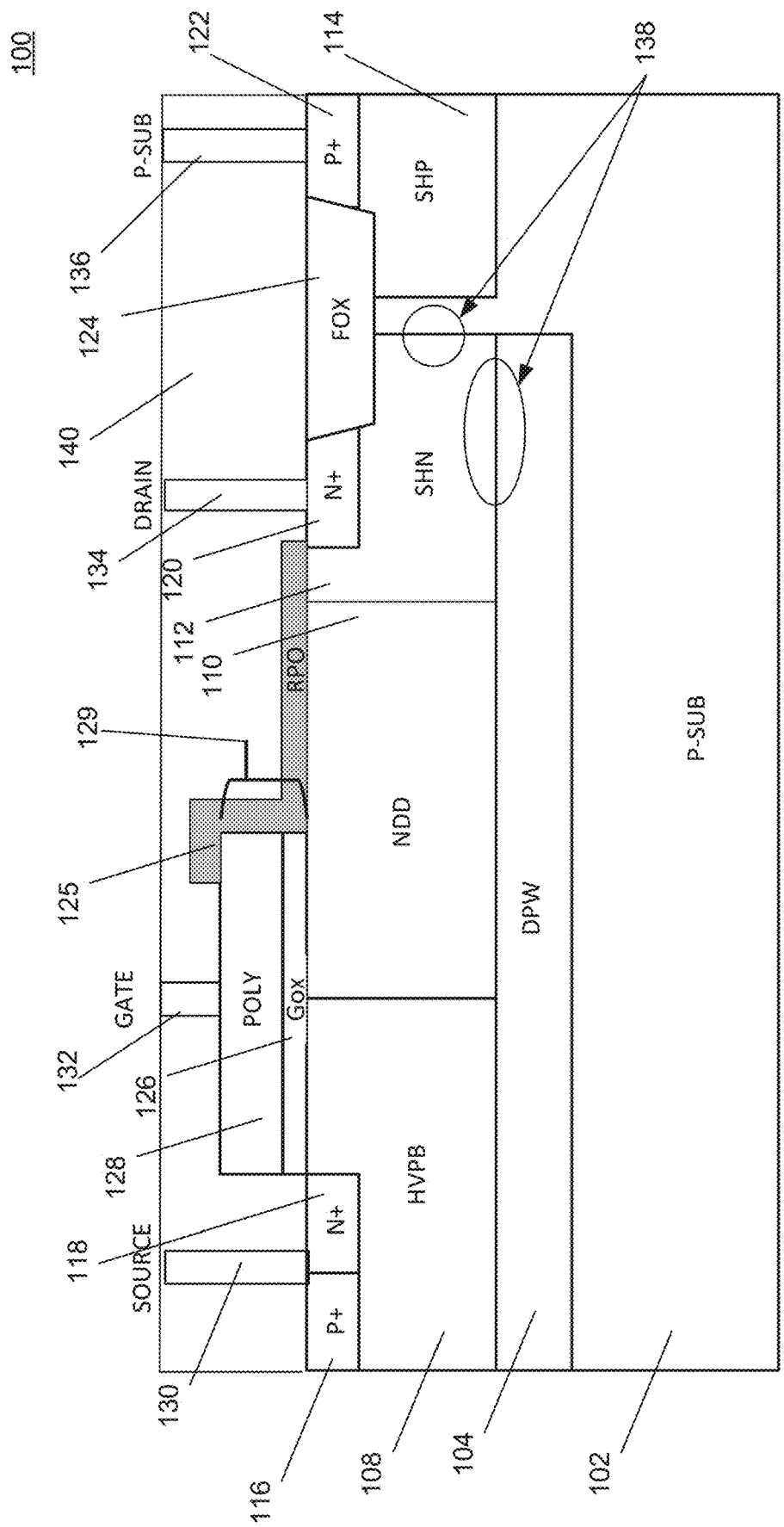
FIG. 1 is a cross-sectional view of an LDMOS device structure according to some embodiments.

This description of the exemplary embodiments is intended to be read in connection with the accompanying drawings, which are to be considered part of the entire written description. The following disclosure provides many different embodiments, or examples, for implementing different features of the provided subject matter. The drawings are not to scale and the relative sizing and placement of structures have been modified for clarity rather than dimensional accuracy. Specific examples of components, values, operations, materials, arrangements, or the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to the structures, designs, and manufacturing methods for LDMOS devices, including high-voltage LDMOS devices. The structures and methods detailed below produce improved LDMOS output characteristics, e.g., on-state Id-Vd tailing, that are associated with higher drain-side electrical fields, in order to achieve a suitable combination of improved breakdown voltage in the off state (BVoff), resistance spreading (Rsp), and safe operating area (SOA) performance. Previous efforts have included, for example, adding an extra well implant on the drain side in order to suppress the high electrical field and achieve improved Id-Vd tailing, but the small-tilt, high-dose, high-energy well implants tend to decrease the BVoff while tending to increase the handling, manufacturing costs, and defect risks as a result of adding an additional implant mask layer to an already complex manufacturing process.

FIG. 1 is a cross-sectional view of an as-manufactured LDMOS structure 100 according to some embodiments. The LDMOS structure 100, according to some embodiments, includes a P-type substrate (P-sub) 102, a field oxide (FOX) region 124 for defining an active area, a deep P-well (DPW) 104 formed in the P-type substrate 102, a high-voltage P-type implanted (HVPB) region 108 in the DPW, an N-type drift region doping (NDD) region 110 in the DPW adjacent the HVPB region, a shield N-well (SHN) region 112 in the DPW adjacent the NDD region, and a shield P-well (SHP) region 114 in the P-sub.

The LDMOS structure 100, according to some embodiments, also includes a P-type source contact region 116 and an N-type source contact region 118 in the HVPB, an N+ drain contact region 120 in the SHN, and a P+ P-sub contact region 122 in the SHP. The LDMOS structure 100, according to some embodiments, further includes a gate oxide (Gox) 126 and a gate conductor (POLY) 128, collectively a gate stack 129, provided over adjacent portions of the HVPB and NDD regions. According to some embodiments, the gate stack 129 will include sidewall structures (not shown) and/or portions of the original polysilicon gate conductor that have been subjected to a silicide or salicide process in order to reduce the resistivity of the gate conductor.

In some embodiments, a portion of the gate stack and the NDD region will be protected during manufacture by a resist protective oxide (RPO) layer 125 that includes alternating layers of silicon dioxide (SiO2) and silicon nitride (Si3N4) arranged in, for example, an Oxide/Nitride (ON) or an Oxide/Nitride/Oxide/Nitride (ONON) laminar configuration. In some embodiments, an interlayer dielectric (ILD) (140) is then deposited, patterned, and etched to form a series of contact holes that expose portions of the top surfaces of the P+/N+ source contact regions 116, 118, gate stack 129, N+ drain contact 120, and the P+ P-sub contact 122. In some embodiments, an initial metal layer (M0) (not shown) is then deposited on the ILD to fill the contact openings and, after chemical mechanical planarization (CMP), to form a source contact 130, a gate contact 132, a drain contact 134, and a P-sub contact 136 that will provide electrical contact to subsequent metal layers. In some embodiments, the configuration of the various structures comprising LDMOS structure 100 will, in operation, produce stronger electrical fields in higher-field regions 138 in which the SHN region 112 abuts the P-sub region 102 and/or DPW region 104.

Figure 2A:
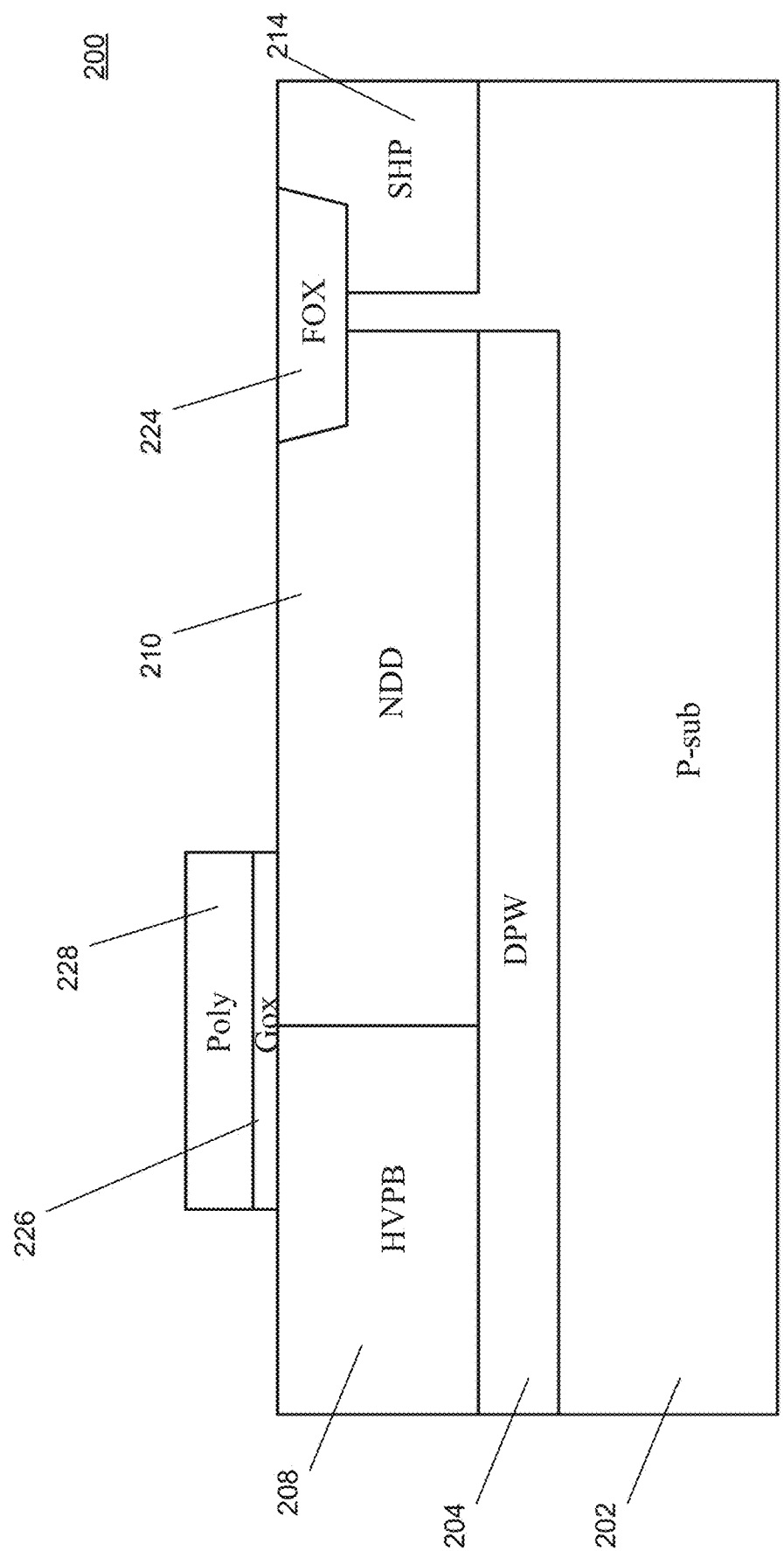
FIGS. 2A-2E are cross-sectional views of during manufacturing of an LDMOS device structure according to some embodiments.

FIG. 2A is a cross-sectional view of an intermediate structure during the process of manufacturing LDMOS structure 200 according to some embodiments which include a P-type substrate (P-sub) 202, a field oxide (FOX) region 224 for defining an active area, a deep P-well (DPW) 204 formed in the P-type substrate 202, a high-voltage P-type implanted (HVPB) region 208 in the DPW, an N-type drift doping (NDD) region 210 in the DPW adjacent the HVPB region, and a SHP region 214 in the P-sub.

Figure 2B:
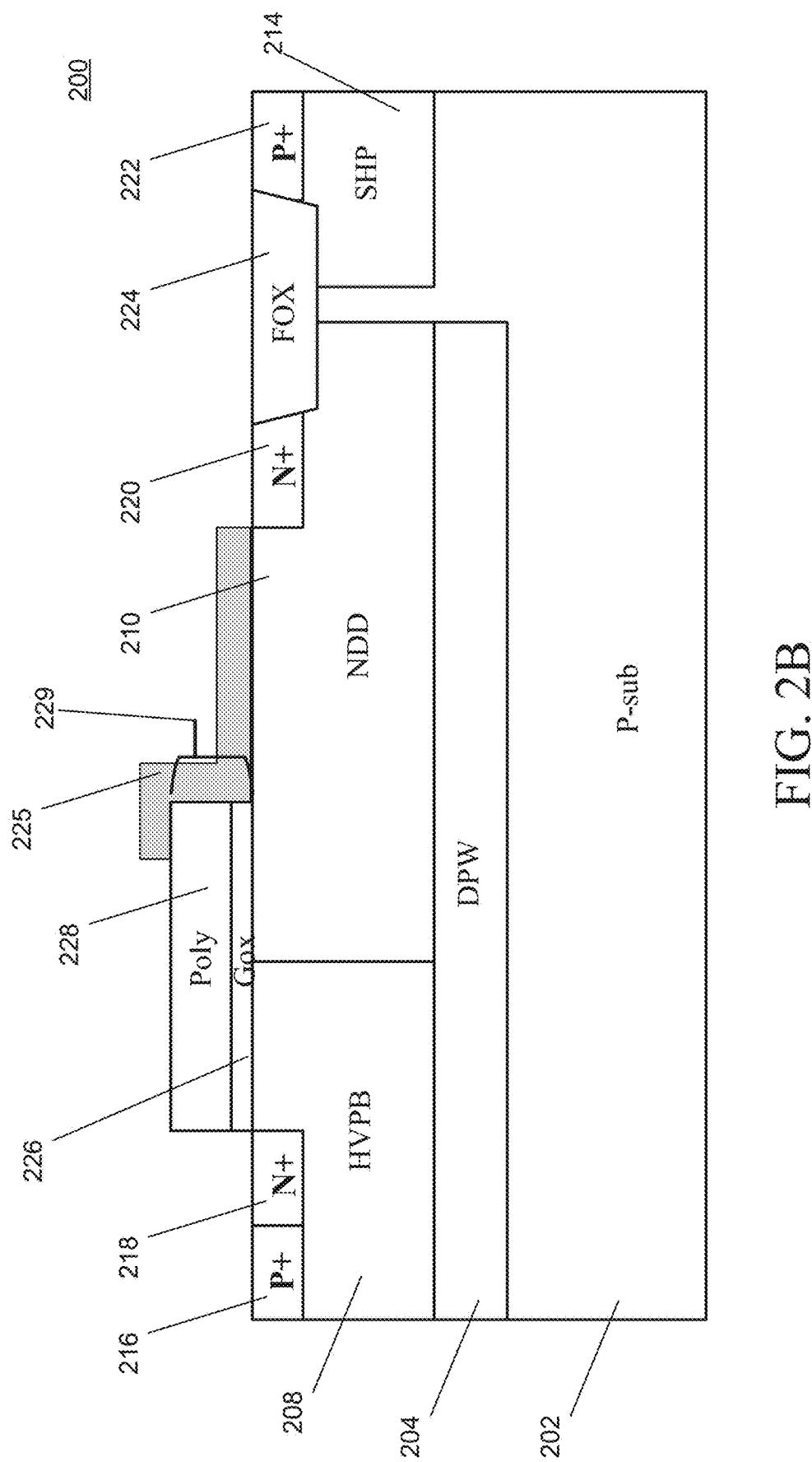

FIG. 2B is a cross-sectional view of another intermediate structure during the process of manufacturing LDMOS structure 200 according to some embodiments which also include the formation of a P-type source contact region 216 and an N-type source contact region 218 in the HVPB, an N+ drain contact region 220 in the NDD adjacent the field oxide region 224, and a P+ P-sub contact region 222 in the SHP. The LDMOS structure 200, according to some embodiments, further includes formation of a gate oxide (Gox) 226 and a gate conductor (POLY) 228, collectively a gate stack 229, provided over adjacent portions of the HVPB and NDD regions. According to some embodiments, the gate stack 229 will include sidewall structures (not shown) and/or portions of the original polysilicon gate conductor that have been subjected to a silicide or salicide process in order to reduce the resistivity of the gate conductor. In some embodiments, a portion of the gate stack and the NDD region will be protected during manufacture by a resist protective oxide (RPO) layer 225 that includes alternating layers of silicon dioxide (SiO2) and silicon nitride (Si3N4) arranged in, for example, a two-layer Oxide/Nitride (ON) laminar configuration or a four-layer Oxide/Nitride/Oxide/Nitride (ONON) laminar configuration.

Figure 2C:
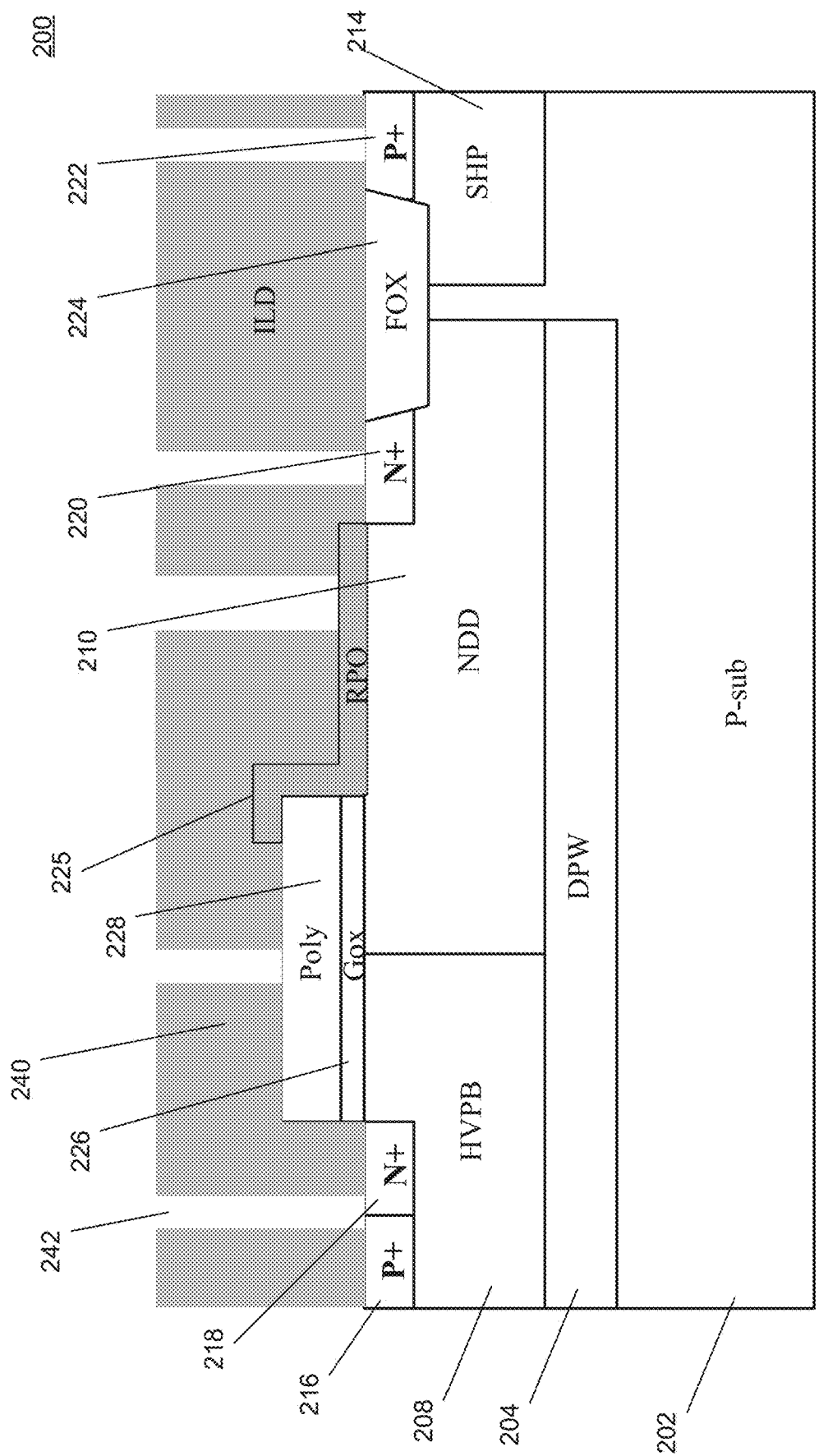

FIG. 2C is a cross-sectional view of another intermediate structure during the process of manufacturing LDMOS structure 200 in which an interlayer dielectric layer 240 is then deposited, patterned, and etched to form a series of contact holes 242 that expose portions of the top surfaces of the P+/N+ source contact regions 216, 218, gate stack 229, N+ drain contact 220, the P+ P-sub contact 222, and the RPO layer 225.

Figure 2D:
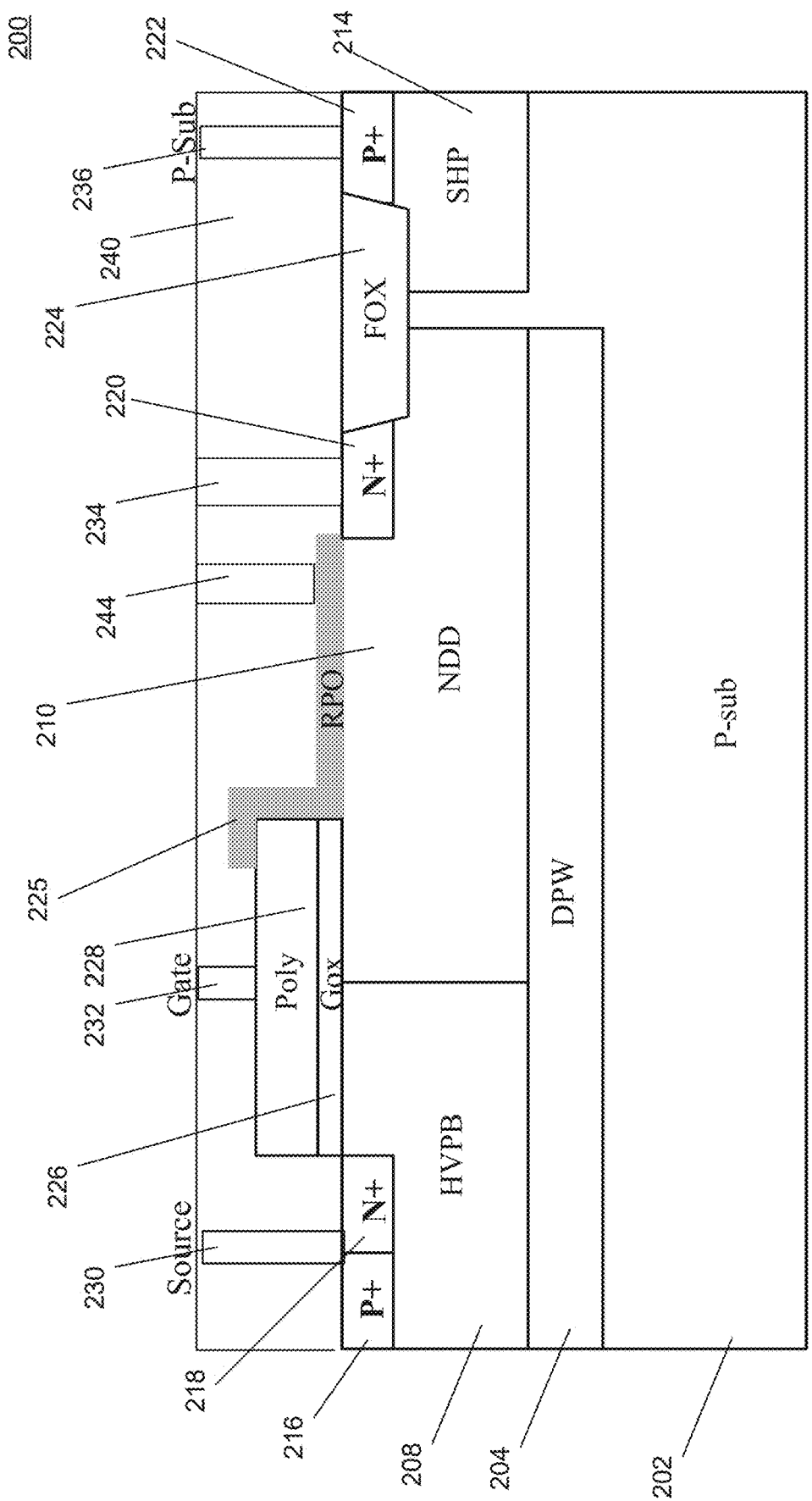

FIG. 2D is a cross-sectional view of another intermediate structure during the process of manufacturing LDMOS structure 200 in which an initial metal layer (M0) (not shown) is then deposited on the ILD to fill the contact openings and, after chemical mechanical planarization (CMP), to form a source contact 230, a gate contact 232, a drain contact 234, a P-sub contact 236, and a field plate contact 244, the field plate contact being closer to the drain contact than the gate contact. These contacts will provide electrical contact to subsequent metal layers, e.g., the metal 1 (M1) layer.

Figure 2E:
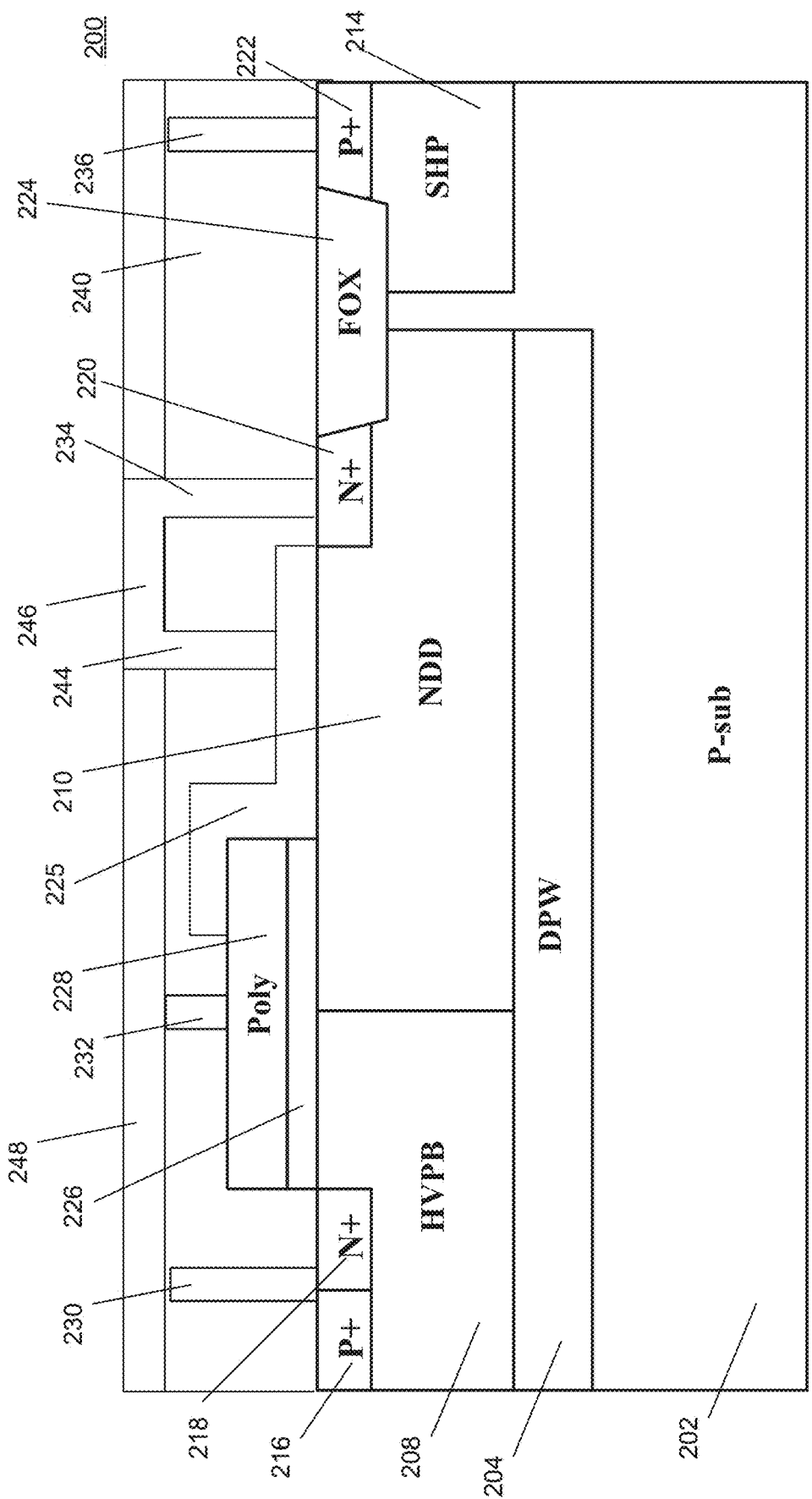

FIG. 2E is a cross-sectional view of another intermediate structure during the process of manufacturing LDMOS structure 200 in which a second interlayer dielectric layer 248 is deposited on the contacts. In some embodiments, the second ILD 248 is etched to expose the top surfaces of specific contact including, for example, the drain contact 234 and the field plate contact (CFP) 244 and remove a portion of the second ILD layer between the exposed contacts. A metal layer (M1) (not shown) is then deposited on the second ILD to fill the opening(s) between the exposed contacts and, after chemical mechanical planarization (CMP), to form a metal pattern 246 that establishes an electrical connection between the drain contact 234 and the field plate contact 244. The metal pattern 246 ensures that the same drain voltage (Vd or Vdd) will be applied to both the drain and field plate contacts simultaneously. Additional operations including depositing ILD layers, contact/via patterning, contact/via etching, metal depositions, metal patterning, and metal etching and/or CMP will be used to complete the integrated circuit (IC) device.

According to some embodiments, certain of the structural elements shown in the structures of FIG. 1 and FIG. 2E are configured and doped in accord with a set of design rules associated with the manufacturing process being used to create and manufacture the LDMOS device. Some embodiments of the LDMOS devices include regions that are sized and doped within specified ranges including, for example, in some embodiments, an initial P-sub doping concentration of $10^{14}$-$10^{15}$/cm$^3$; the DPW is formed with a doping concentration of $10^{15}$-$10^{17}$/cm$^3$ and a depth of 2-3 μm; the NDD is formed with a doping concentration of $10^{16}$-$10^{17}$/cm$^3$ and a depth of 0.5-1.0 μm; the HVPB is formed with a doping concentration of $10^{17}$-$10^{18}$/cm$^3$ and a depth of 1.5-2.5 μm; the SHN is formed with a doping concentration of $10^{17}$-$10^{18}$/cm$^3$ and a depth of 1-2 μm; the SHP is formed with a doping concentration of $10^{17}$-$10^{18}$/cm$^3$ and a depth of 1-2 μm; N+ region is formed with a doping concentration of $10^{20}$-$10^{21}$/cm$^3$ and a depth of 0.2-0.3 μm; and the P+ region is formed with a doping concentration of $10^{20}$-$10^{21}$/cm$^3$ and a depth of 0.2-0.3 The sizing and doping values provided are intended solely for the guidance of one of ordinary skill in the art and are not to be interpreted as values that are critical or required for manufacturing functional integrated circuit devices according to some embodiments. Indeed, one of skill in the art would be able to manufacture functional semiconductor devices in which one or more of the parameters falls outside the noted ranges without undue experimentation.

According to some embodiments, certain of the structural elements shown in the structures of FIG. 1 and FIG. 2E are configured and deposited/grown in accord with a set of design rules associated with the manufacturing process being used to create and manufacture the LDMOS device. Some embodiments of the LDMOS devices include regions and elements that are deposited and sized to fall within specified ranges including, for example, in some embodiments a FOX depth of 0.3-0.5 µm; a Gox thickness of 0.003~0.03 µm; a gate conductor (POLY) thickness of 0.2-0.3 µm with, in some embodiments, a cobalt (Co) and/or titanium (Ti) silicide formed on the gate conductor; an RPO layer total thickness of 0.05-0.2 µm; with the O/N/O/N layers in a four-layer RPO layer comprising 0.03-0.09 µm oxide/0.01-0.03 µm nitride/0.03-0.09 µm oxide/0.01-0.03 µm nitride and the O/N layers in a two-layer RPO layer comprising 0.03-0.12 µm oxide/0.02-0.08 µm nitride; and an ILD thickness of 0.5-1.5 µm. The thickness values provided above are intended solely for the guidance of one of ordinary skill in the art and are not to be interpreted as values that are critical or required for manufacturing functional integrated circuit devices according to some embodiments. Indeed, one of skill in the art would be able to manufacture functional semiconductor devices in which one or more of the parameters falls outside the noted ranges without undue experimentation.

Figures 3A, 3B:
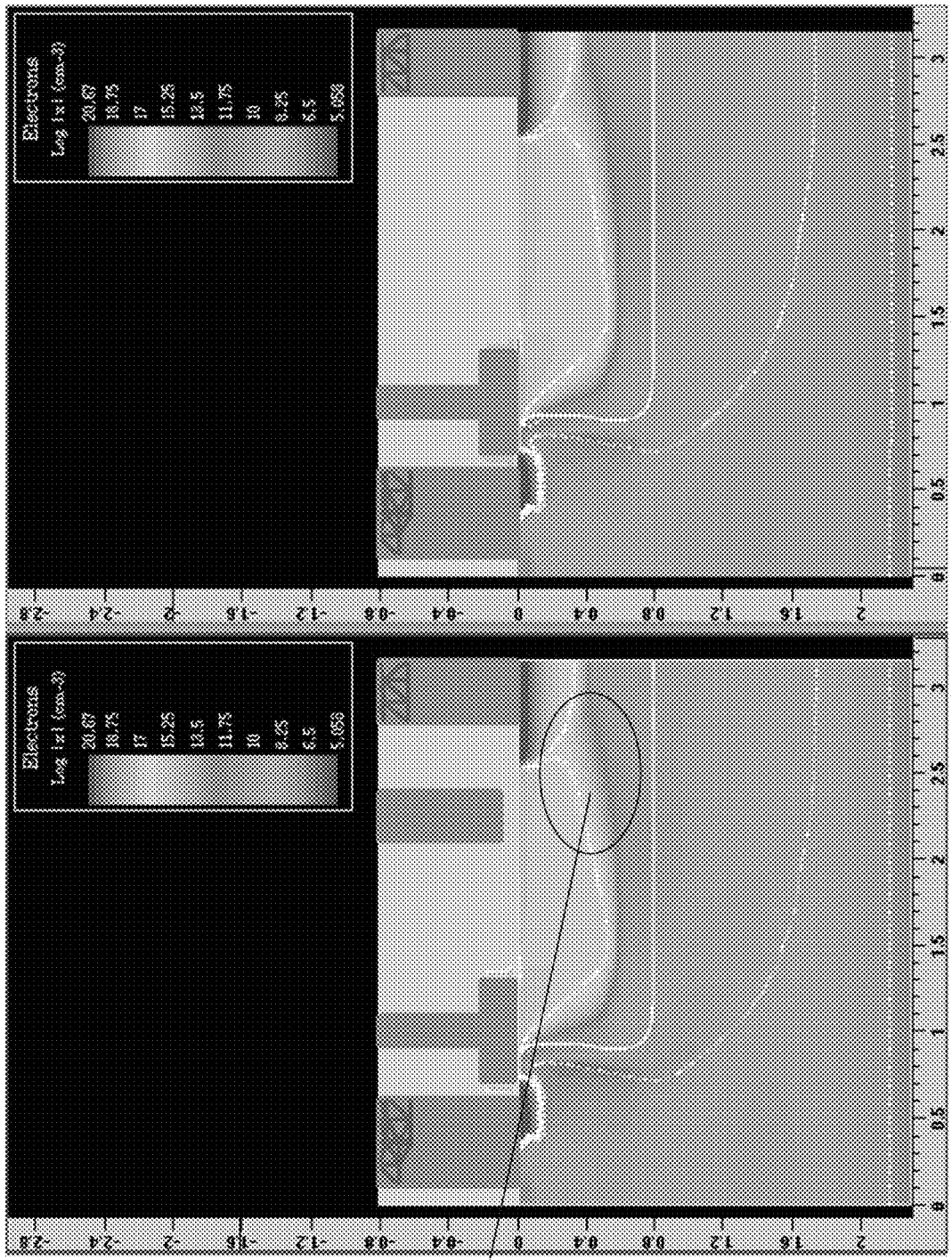
FIGS. 3A-3B are graphs of comparative electron density data for LDMOS structures according to some embodiments.

FIG. 3A is an electron density graph from a simulation prepared using device simulation software for an IC device structure generally corresponding to FIG. 2E. FIG. 3B is an electron density graph from a simulation prepared using device simulation software for an IC device structure generally corresponding to FIG. 1, which lacks the field plate contact structure 244 found in FIG. 2E. Comparing the graphs presented in FIGS. 3A and 3B reveals that a reduction in the electron density is achieved in a portion of the NDD region 338 near the drain contact that will tend to improve the high-voltage (HV) performance of the IC device, particularly with respect to BVoff performance. Device simulation software encompasses, for example, Sentaurus Device, a multidimensional (1D/2D/3D) device simulator, or Taurus Medici, a 2-dimensional device simulator, both of which are useful for modeling the electrical, thermal and/or optical characteristics of a wide variety of semiconductor devices.

Figure 4A:
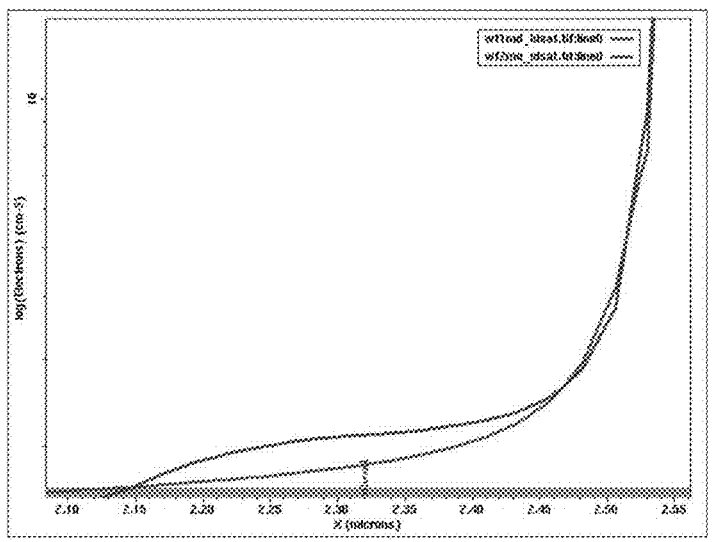
FIGS. 4A-4C are graphs of comparative parametric data for LDMOS structures according to some embodiments.

FIG. 4A is a graph showing the relative electron density from a simulation prepared using device simulation software for IC device structures generally corresponding to FIG. 2E (wf1md—blue) and for an IC device structure generally corresponding to FIG. 1 (wf2md—red), which lacks the field plate contact structure 244 found in FIG. 2E. Comparing the lines plotted on the graph in FIG. 4A reveals that a higher electron density is achieved in the IC structure generally corresponding to FIG. 2E.

Figure 4B:
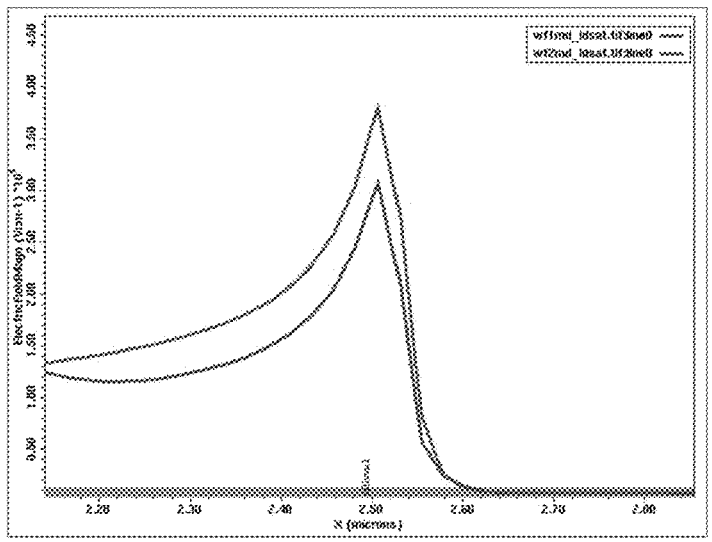

FIG. 4B is a graph showing the relative electric field strength from a simulation prepared using device simulation software for IC devices structure generally corresponding to FIG. 2E (wf1md—blue) and for an IC device structure generally corresponding to FIG. 1 (wf2md—red), which lacks the field plate contact structure 244 found in FIG. 2E. Comparing the lines plotted on the graph in FIG. 4B reveals that a lower electric field strength is achieved in the IC structure generally corresponding to FIG. 2E.

Figure 4C:
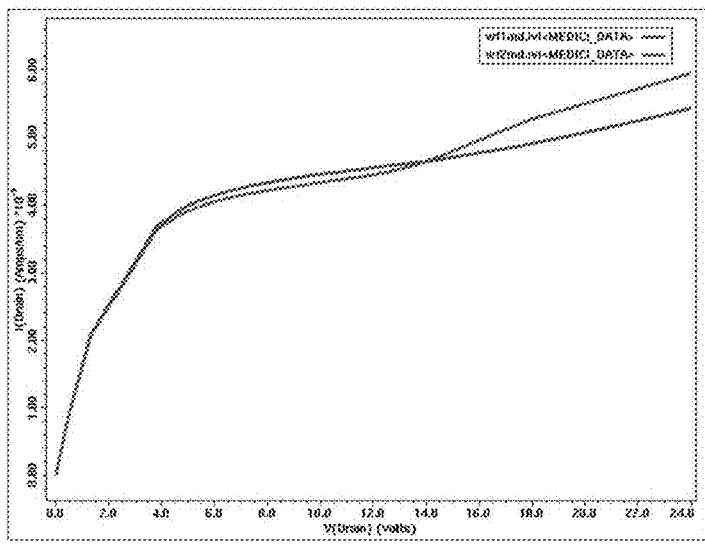

FIG. 4C is a graph showing the relative drain current as a function of drain voltage from a simulation prepared using device simulation software for IC devices structure generally corresponding to FIG. 2E (wf1md—blue) and for an IC device structure generally corresponding to FIG. 1 (wf2md—red), which lacks the field plate contact structure found in FIG. 2E. Comparing the lines plotted on the graph in FIG. 4C reveals that for operating voltages above 14V a lower drain current magnitude is achieved in the IC structure generally corresponding to FIG. 2E. For operation voltages about 20V, the improvement in Id-Vd tailing is about 10%.

Figure 5A:
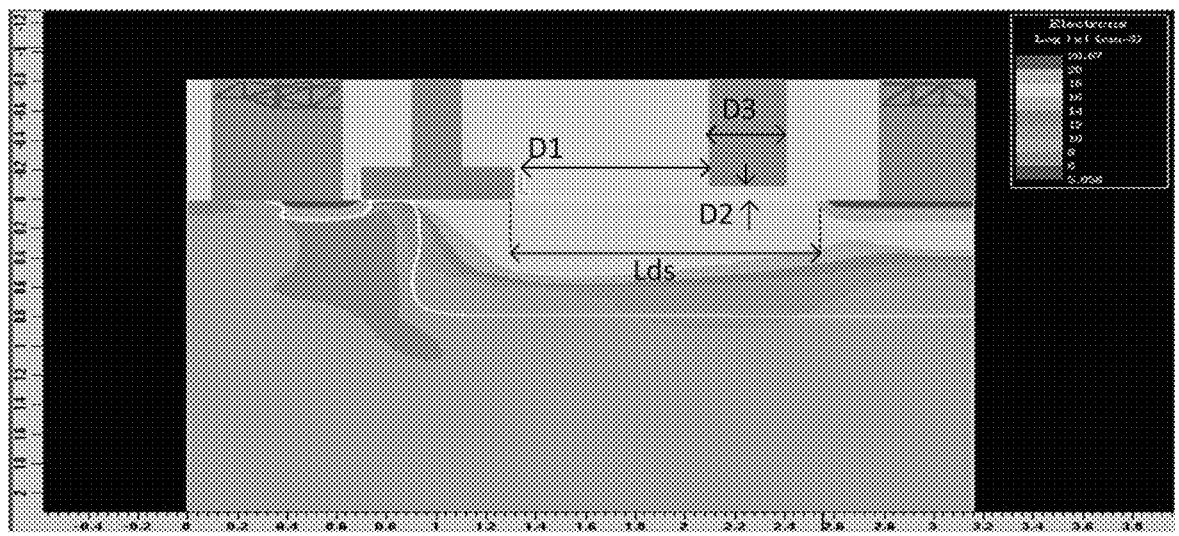
FIGS. 5A-5G are graphs of simulated parametric data for various LDMOS structures according to some embodiments of an LDMOS device according to FIG. 2E.

FIG. 5A is an electron density graph from a simulation prepared using device simulation software, also referred to as technology computer-aided design (TCAD), for an IC device structure generally corresponding to FIG. 2E that has been labeled with certain relevant dimensions including D1, the field plate contact (CFP) to gate poly distance; D2, the field plate contact to the silicon surface distance (i.e., the residual thickness of the RPO structure after contact etch); D3, the field plate contact (CFP) width, and Lds, the length of the drift region between the gate and the drain structures. The various relationships between device performance and the dimensional elements indicated in FIG. 5A, specifically the dimensions Lds, D1, D2, and D3, are presented in FIGS. 5B-5G as detailed below.

Figure 5B:
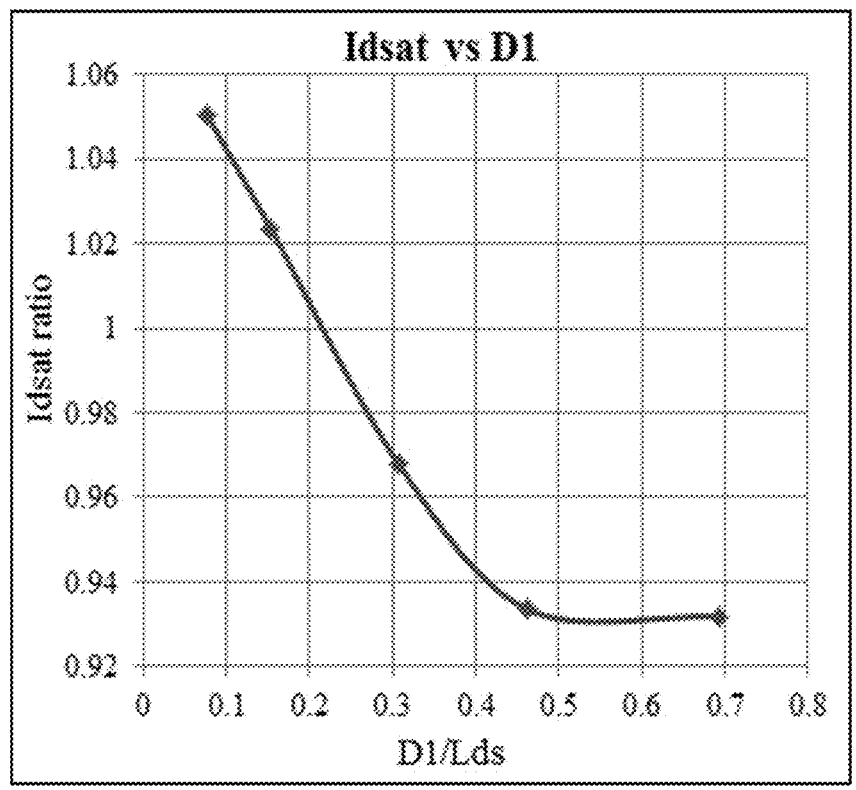

FIG. 5B is a graph of the saturated drain current (Idsat) ratio as a function of a D1/Lds ratio. As reflected in FIG. 5B, the Idsat current decreases as the D1/Lds ratio decreases until a ratio of about 0.45 is reached after which the Idsat values are relatively constant. Accordingly, D1/Lds ratios within about 0.35 and 0.7 maintained the Idsat ratio within a range of about 0.92 and 0.96. As reflected in FIG. 5B, the Idsat ratio is sensitive to the positioning of the field plate contact 244 relative to the gate structure 226/228 and the drain structure 220. In particular, if the field plate contact 244 is arranged too close to the gate structure 226/228, i.e., a D1/Lds ratio of less than about 0.35, the Idsat ratio will exceed the 0.96 target value. Accordingly, ensuring that the field plate contact 244 is arranged to provide sufficient separation between the field plate contact 244 and the gate structure 226/228 will tend to improve the performance of the resulting semiconductor device.

TCAD simulations of LDMOS structures generally corresponding to FIG. 2E and using various D1/Lds ratios suggest that the Id-Vd tailing improvements reflected in FIG. 4C are attributable to an increased electron concentration near the drain side of the NDD 210 with the increased electron concentration acting as a buffer for the on-state depletion area adjacent the drain side N+ contact 220 and thereby reducing the drain side electrical field. The reduced electrical field, in turn, suppresses the impaction ionization and impaction ionization current near the drain side of the NDD 210, leading to improved Id-Vd tailing performance.

The D1/Lds ratio is critical to achieving the noted improvements in the Id-Vd tailing performance of LDMOS devices according to some embodiments, particularly those LDMOS devices operating voltages in excess of 14V. The lower limit of the D1/Lds ratio will be dependent on the target maximum Idsat ratio value associated with a particular design, but for LDMOS device designs generally corresponding to FIG. 2E and having a target maximum Idsat ratio value of 0.96, the D1/Lds ratio should not be less than 0.35 and preferably, at least 0.40. The upper limit of the D1/Lds ratio will be dependent on the design rules applicable to the specific manufacturing process being used to manufacture the semiconductor device but will be at least 0.7. If the value of the D1/Lds ratio is too low, the variability of the Idsat ratio will increase and will tend to exceed the predetermined target value. Conversely, if the value of the D1/Lds ratio is too high, the placement of the field plate contact 244 will be more likely to violate the minimum contact-to-contact spacing requirements of design rules of the applicable manufacturing process.

Figure 5C:
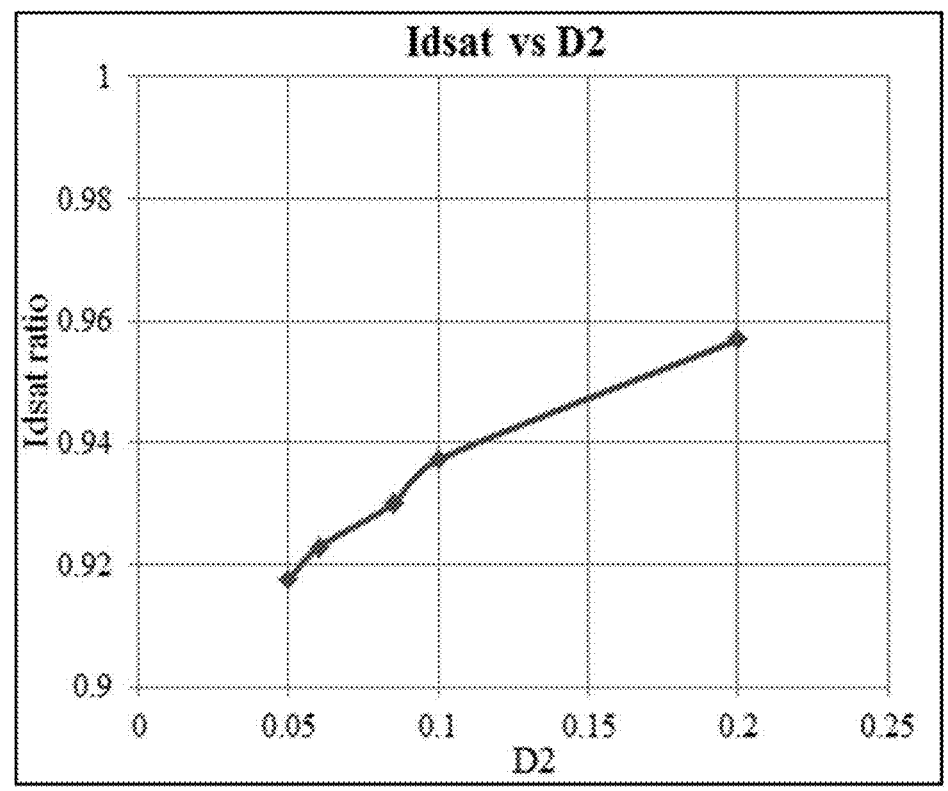

FIG. 5C is a graph of the saturated drain current (Idsat) ratio as a function of D2. As reflected in FIG. 5C, the Idsat current increased as the length of D2 (RPO thickness) increased. D2 values within about 0.05 and 0.2 μm maintained the Idsat ratio within a range of about 0.92 and 0.96. If the D2 value is too low, then the Idsat ratio will fall below the lower target value of 0.92. If the D2 value is too high, then the Idsat ratio will fall above the upper target value of 0.96.

Figure 5D:
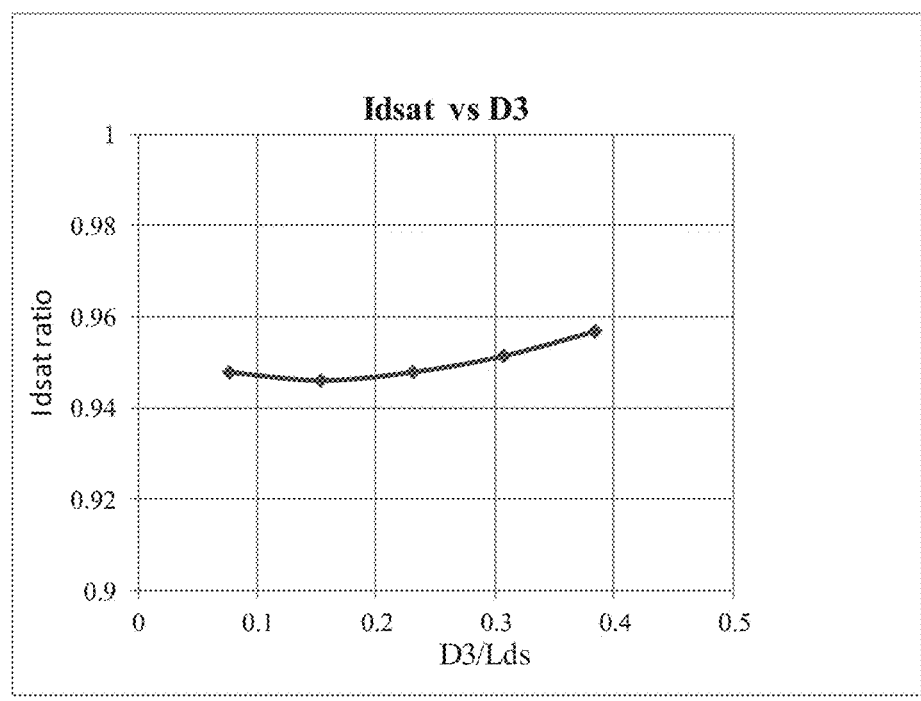

FIG. 5D is a graph of the saturated drain current (Idsat) ratio as a function of D3/Lds. As reflected in FIG. 5D, the Idsat current ratio is relatively constant (0.94-0.96) for a range of D3/Lds ratios. D3/Lds ratios within a range of about 0.07 to 0.37 maintained the Idsat ratio within a range of about 0.94 and 0.96. If the D3/Lds ratio value is too low, then the field plate contact 244 will be difficult to pattern and etch consistently. If the D3/Lds ratio value is too high, then the effects of the field plate contact 244 will not be focused on the portion of the NDD region 338 for reducing the electrical field for improving the HV performance of the device.

Figure 5E:
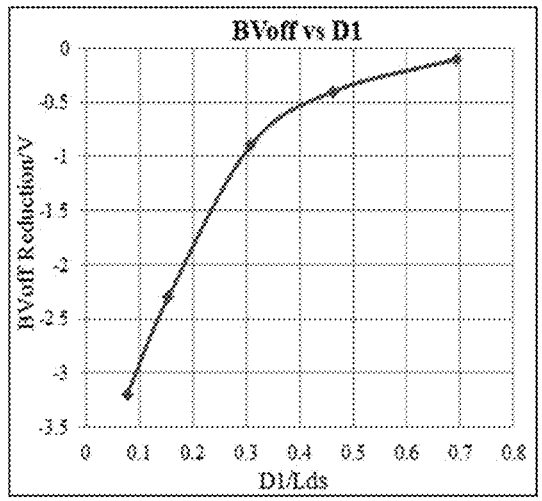

FIG. 5E is a graph of the breakdown voltage off (BVoff) reduction as a function of D1/Lds. As reflected in FIG. 5E, the BVoff reduction improves as the location of the field plate contact is moved away from the gate structure and toward the drain structure. D1/Lds values between 0.4 and 0.7 maintained the Idsat ratio within a range of about 0.92 and 0.96 while D1/Lds values below about 0.35 exhibited an Idsat ratio greater than 0.96.

Figure 5F:
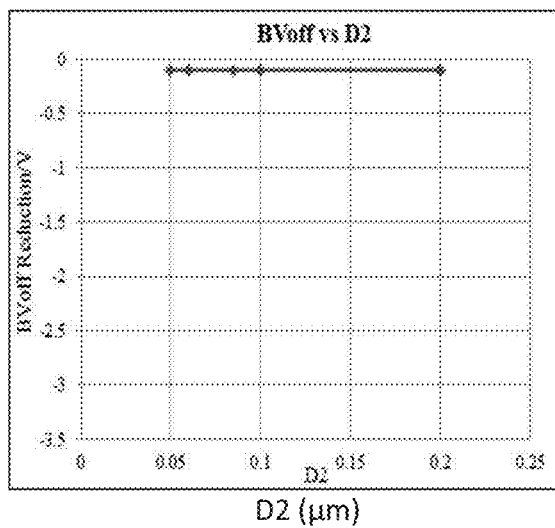

FIG. 5F is a graph of the breakdown voltage off (BVoff) reduction as a function of D2. As reflected in FIG. 5F, the BVoff reduction is generally insensitive to the thickness of the RPO structure.

Figure 5G:
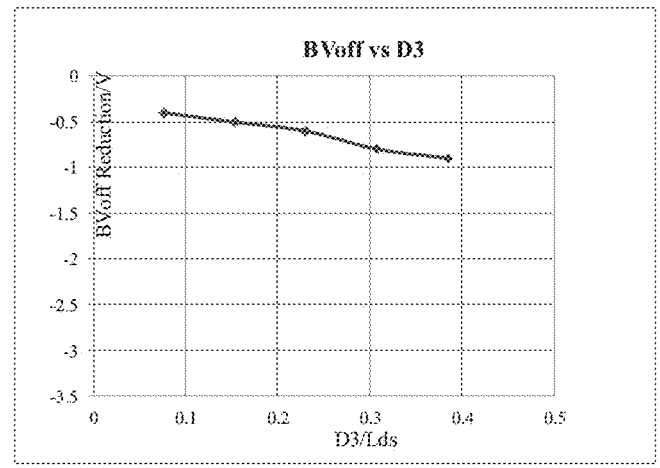

FIG. 5G is a graph of the breakdown voltage off (BVoff) reduction as a function of the ratio of D3/Lds. As reflected in FIG. 5G, the BVoff reduction slowly declines as the D3/Lds ratio increases. Accordingly, the D3/Lds ratio will typically be maintained within a range of from 0.1 to 0.3.

Figure 6:
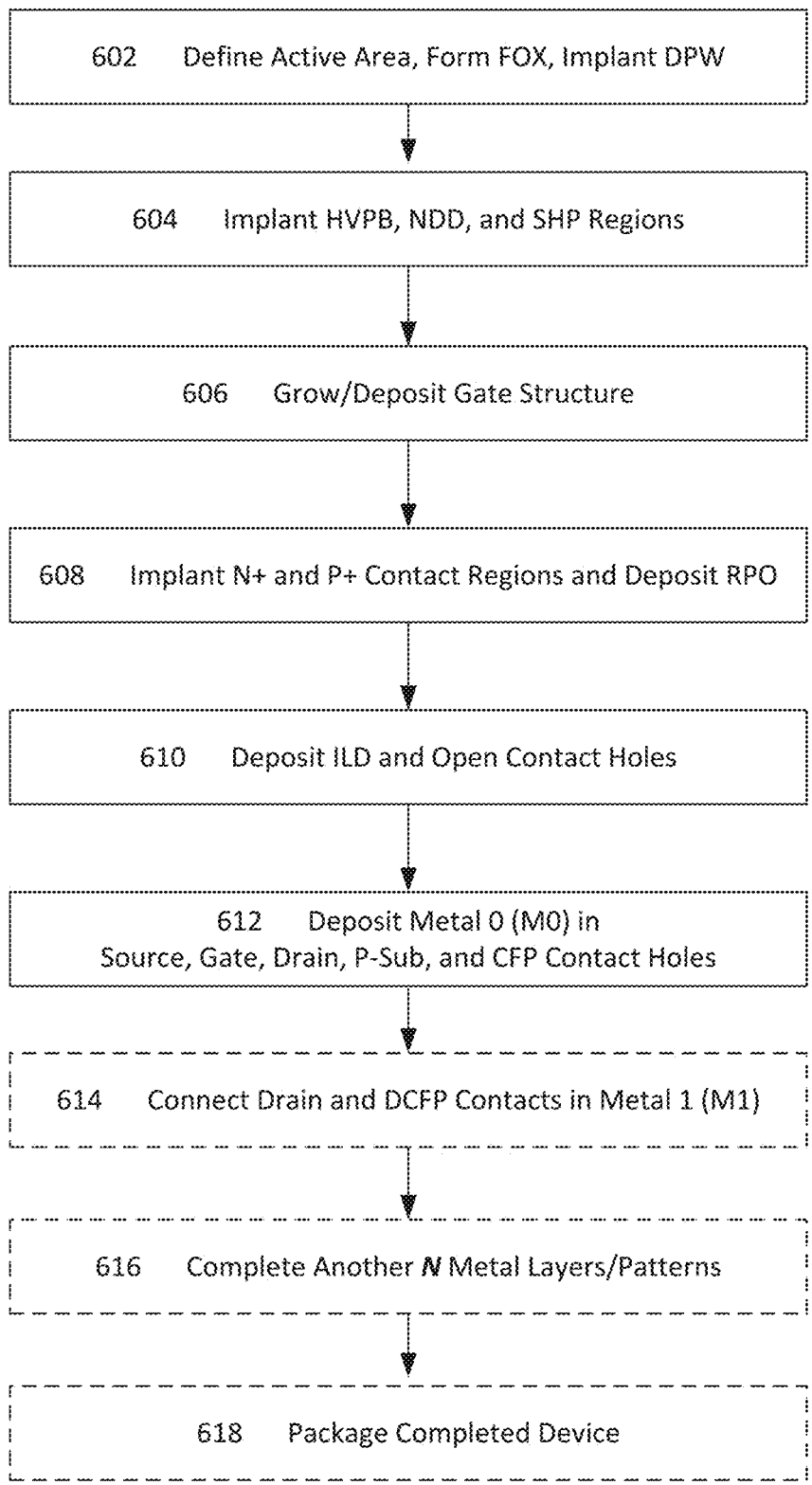
FIG. 6 is a flowchart of a method of manufacturing an LDMOS device according to some embodiments.

FIG. 6 is a flowchart of a method 600 of manufacturing an LDMOS device according to some embodiments corresponding to FIG. 2E that comprise a sequential series of operations including operation 602 during which the active areas are defined on the P-type substrate 202, a field oxide (FOX) region 224 is formed to separate the active areas. According to some embodiments, a deep P-well (DPW) 204 is then formed in the P-type substrate 202.

According to some embodiments of method 600, during operation 604, a high-voltage P-type implanted (HVPB) region 208 is formed in the DPW, an N-type drift doping (NDD) region 210 is formed in the DPW adjacent the HVPB region, and a SHP region 214 is formed in the P-sub 202, the SHP region being separated from the NDD region 210 by the FOX.

According to some embodiments of method 600, operation 606 includes forming a gate stack 229 comprising a layer of gate oxide 226 on adjacent surfaces of the HVPB and NDD regions and forming a layer of polysilicon to serve as a gate conductor 228 on the gate oxide. According to some embodiments, a portion of the gate conductor is used to form a silicide with cobalt (Co), titanium (Ti), or other suitable metal(s), as well as suitable alloys and mixtures thereof, and thereby lower the resistance of the gate conductor 228. In some embodiments, a gate sidewall structure (not shown) is formed adjacent the gate stack 229.

According to some embodiments of method 600, operation 608 includes forming a P-type source contact region 216 and an N-type source contact region 218 in the HVPB, an N+ drain contact region 220 in the NDD adjacent the field oxide region 224, and a P+ P-sub contact region 222 in the SHP. In some embodiments, operation 608 includes forming a resist protective oxide (RPO) layer 225 that includes alternating layers of silicon dioxide (SiO2) and silicon nitride (Si3N4) arranged in, for example, a two-layer Oxide/Nitride (ON) laminar configuration or a four-layer Oxide/Nitride/Oxide/Nitride (ONON) laminar configuration. Although the ON and ONON configurations have been utilized successfully in the manufacture of semiconductor devices, one of skill in the art would be able to manufacture functional semiconductor devices using one or more other dielectric materials for forming the RPO 224 structure without undue experimentation.

According to some embodiments of method 600, operation 610 includes forming an interlayer dielectric layer 240 that is then patterned and etched to form a series of contact holes 242 that expose portions of the top surfaces of the P+/N+ source contact regions 216, 218, the gate stack 229, the N+ drain contact 220, the P+ P-sub contact 222, and the RPO layer 225.

According to some embodiments of method 600, operation 612 includes depositing an initial metal layer (M0) (not shown) on the patterned and etched ILD layer 240 to fill the contact openings and, after chemical mechanical planarization (CMP), to form a source contact 230, a gate contact 232, a drain contact 234, a P-sub contact 236, and a field plate contact 244, the field plate contact being closer to the drain contact than the gate contact. These contacts will provide electrical contact to subsequent metal layers, e.g., the metal 1 (M1) layer. In some embodiments, the configuration of the various structures comprising LDMOS structure 200 will, in operation, tend to produce stronger electrical fields (and, consequently, exhibit lower BVoff values) in higher-field regions 138 in which the SHN region 112 abuts the P-sub region 102 and/or DPW region 104.

According to some embodiments of method 600, optional operation 614 includes forming a second interlayer dielectric layer 248 on the contacts. In some embodiments, the second ILD 248 is then patterned and etched to expose the top surfaces of specific contacts including, for example, the drain contact 234 and the field plate contact 244 and a remove portion of the second ILD layer between the exposed contacts. A metal layer (M1) (not shown) is then deposited on the second ILD 248 to fill the opening(s) between the exposed contacts and, after chemical mechanical planarization (CMP), to form a metal pattern 246 that establishes an electrical connection between the drain contact 234 and the field plate contact 244. The metal pattern 246 ensures that the same drain voltage (Vd or Vdd) will be applied to both the drain contact 234 and field plate contact 244 simultaneously.

According to some embodiments of method 600, optional operation 616 includes depositing additional ILD layers, applying contact/via patterns to the ILD layers, etching the contact/via patterns, depositing metal layers, removing portions of the metal layers using metal patterning and etching and/or CMP to form additional interconnection patterns that will produce an IC device having the designed functionality. According to some embodiments of method 600, optional operation 618 includes packaging the completed IC device in a format suitable for use in electronic equipment. Within embodiments of method 600, operations 612 and 614 form the field plate contact 244 and provide for an electrical connection between the field plate contact 244 and drain contact 234. The formation of these structures allows the drain voltage to be applied to the field plate contact 244 to achieve the improved HV performance of the resulting IC devices as shown in, e.g., FIGS. 3A and 4C.

Figure 7:
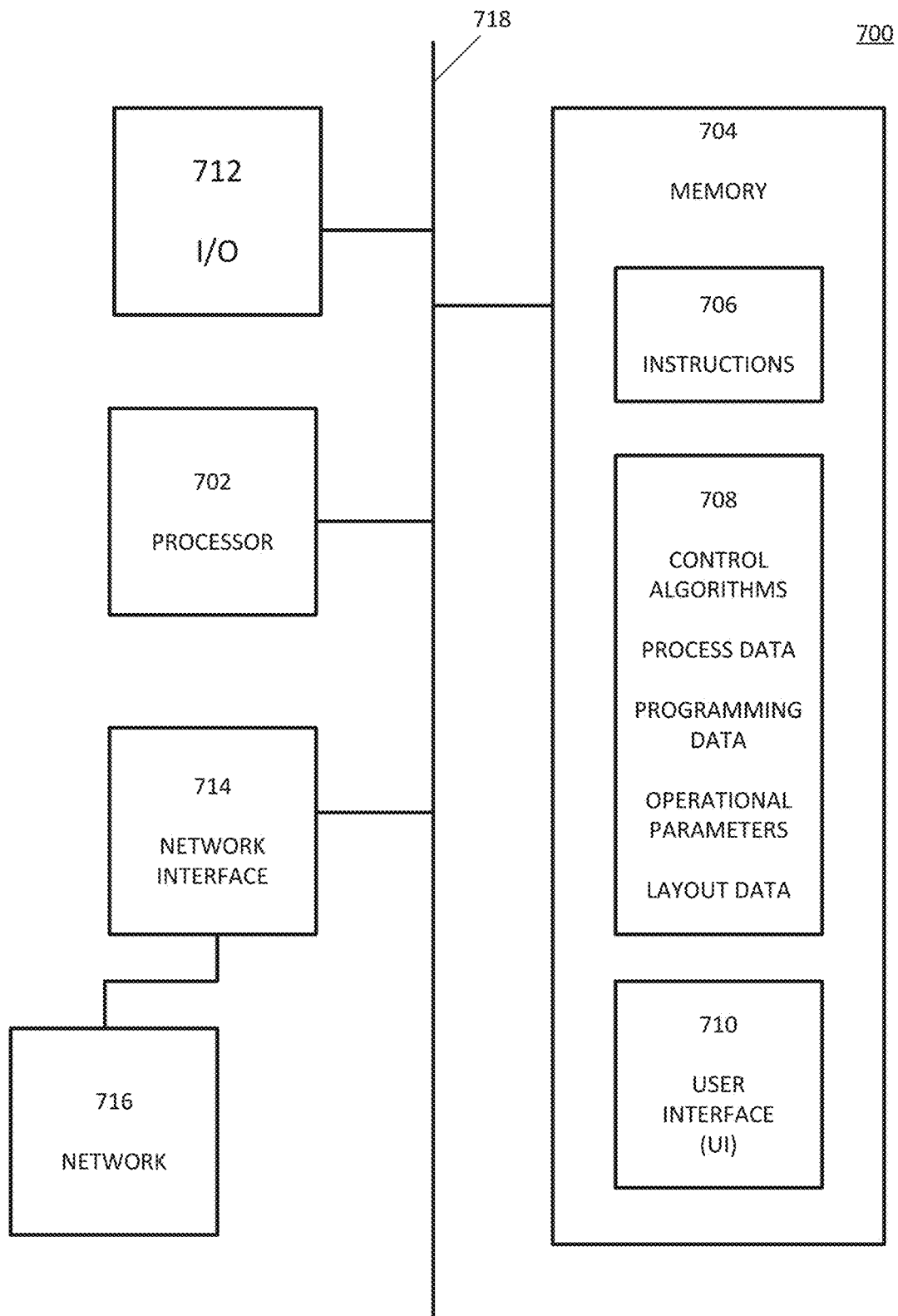
FIG. 7 is a schematic diagram of a system for manufacturing LDMOS devices according to some embodiments.

FIG. 7 is a block diagram of an electronic process control (EPC) system 700, in accordance with some embodiments. Methods used for generating cell layout diagrams corresponding to some embodiments of the LDMOS structures detailed above, particularly with respect to the addition and placement of the field plate contact on the RPO structure are implementable, for example, using EPC system 700, in accordance with some embodiments of such systems. In some embodiments, EPC system 700 is a general purpose computing device including a hardware processor 702 and a non-transitory, computer-readable, storage medium 704. Computer-readable storage medium 704, amongst other things, is encoded with, i.e., stores, computer program code (or instructions) 706, i.e., a set of executable instructions. Execution of computer program code 706 by hardware processor 702 represents (at least in part) an EPC tool which implements a portion or all of, e.g., the methods described herein in accordance with one or more (hereinafter, the noted processes and/or methods).

Hardware processor 702 is electrically coupled to computer-readable storage medium 704 via a bus 718. Hardware processor 702 is also electrically coupled to an I/O interface 712 by bus 718. A network interface 714 is also electrically connected to hardware processor 702 via bus 718. Network interface 714 is connected to a network 716, so that hardware processor 702 and computer-readable storage medium 704 are capable of connecting to external elements via network 716. Hardware processor 702 is configured to execute computer program code 706 encoded in computer-readable storage medium 704 in order to cause EPC system 700 to be usable for performing a portion or all of the noted processes and/or methods. In one or more embodiments, hardware processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause the EPC system 700 (where such execution represents (at least in part) the EPC tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores process control data 708 including, in some embodiments, control algorithms, process variables and constants, target ranges, set points, programming control data, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to hardware processor 702.

EPC system 700 also includes network interface 714 coupled to hardware processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to receive information through I/O interface 712. The information received through I/O interface 712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 702. The information is transferred to hardware processor 702 via bus 718. EPC system 700 is configured to receive information related to a user interface (UI) through I/O interface 712. The information is stored in computer-readable medium 704 as user interface (UI) 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
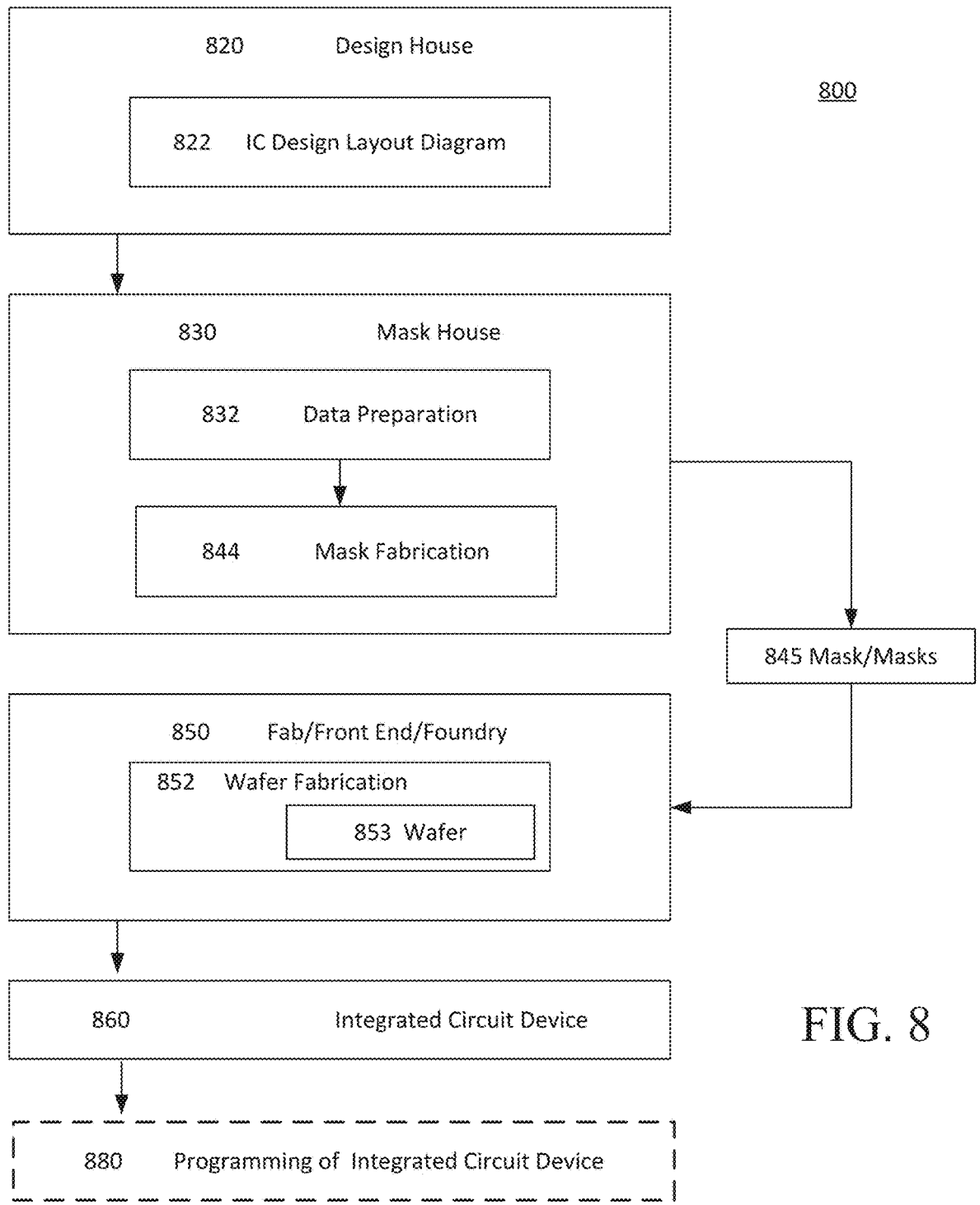
FIG. 8 is a flowchart of IC device design, manufacture, and programming.

FIG. 8 is a block diagram of an integrated circuit (IC) manufacturing system 800, and an IC manufacturing flow associated therewith, in accordance with some embodiments for manufacturing LDMOS devices that incorporate a field plate contact structure as detailed above. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in manufacturing system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC Fab 850 is owned by a single larger company. In some embodiments, two or more of design house 820, mask house 830, and IC Fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features.

For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The IC design layout diagram 822 is manipulated by mask data preparation 832 to comply with particular characteristics of the mask writer and/or requirements of IC Fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC Fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask.

In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC Fab 850 includes wafer fabrication 852. IC Fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 852 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 845 include a single layer of mask material. In some embodiments, a mask 845 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$), potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC Fab 850 uses mask(s) 845 fabricated by mask house 830 to fabricate IC device 860. Thus, IC Fab 850 at least indirectly uses IC design layout diagram 822 to fabricate IC device 860. In some embodiments, semiconductor wafer 853 is fabricated by IC Fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Thus, IC Fab 850 at least indirectly uses IC design layout diagram 822 to fabricate IC device 860. In some embodiments, semiconductor wafer 853 is fabricated by IC Fab 850 using mask(s) 845 to form IC device 860.

Details regarding an integrated circuit (IC) manufacturing system (e.g., manufacturing system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

In some embodiments, conductive lines are created within the integrated circuit by depositing a layer of dielectric material on a layer of the integrated circuit having gate structures therein, followed by forming an opening in the dielectric material at the location of at least one track. In some embodiments, metallic seed material is added to exposed surfaces within the opening in the dielectric material and a layer of conductive material is added to the opening over the seed layer. In some embodiments, the layer of conductive material is added by electroplating. In some embodiments, the layer of conductive material is added by sputtering, e.g., from a metal target. In some embodiments, the layer of conductive material is added by chemical vapor deposition, including one or more of chemical vapor deposition (CVD), plasma-enhanced chemical vapor deposition (PECVD), atomic layer deposition (ALD), and the like. In some embodiments, conductive material on top of the layer of dielectric material is removed from the top of the layer of dielectric material by chemical mechanical polishing (CMP) and/or plasma etching to isolate portions of the conductive material in the openings within the layer of dielectric material.

In some embodiments, the conductive lines along various tracks of the integrated circuit layout or manufactured integrated circuit are separated from each other, by removing a length of a conductive line between two other conductive lines, and filing the volume of the removed length of conductive line with dielectric material (e.g., making a trench isolation structure between two conductive lines, wherein the trench isolation structure and the conductive lines each extend along the first direction). In some embodiments, portions of one or more adjoining conductive lines are isolated by etching through the conductive lines to form an insolation structure that extends in a second direction different from the direction in which the conductive lines extend through the layer of the integrated circuit.

Integrated circuits according to some embodiments include an n-type drift region, a gate structure on a first portion of the n-type drift region, a drain structure in a second portion of the n-type drift region, the gate structure and the drain structure being separated by a drift region length (Lds), a resist protective oxide (RPO) over the n-type drift region and between the gate structure and the drain structure, and a field plate contact in direct electrical connection to the resist protective oxide configured for applying a voltage to the resist protective oxide. Other embodiments of the integrated circuits include a conductive structure in direct electrical connection between the drain contact and the field plate contact wherein the applied voltage will be the drain voltage, a field plate contact that is separated from the gate structure by a first distance (D1), with the first distance being at least 40% of the Lds, a first distance that is between 40% and 70% of the Lds, a field plate contact that has a contact width (D3) that is between 10% and 30% of the Lds, a field plate contact including a first field plate contact having a first contact width and a second field plate contact having a second contact width in which the first contact and second contact widths are at least 10% of the Lds, a resist protective oxide having an RPO thickness (D2) that is at least 10% of the Lds, a resist protective oxide having an RPO thickness (D2) that is between 0.05 µm and 0.2 µm, and/or an Lds of at least 0.5 µm.

Methods of manufacturing according to some embodiments include a series of sequential operations including implanting a deep P-well in a P-type substrate, implanting an n-type drift region in the deep P-well, depositing a gate structure on a first portion of the n-type drift region, implanting a drain structure in a second portion of the n-type drift region, the gate structure and the drain structure being separated by a drift region length (Lds), depositing a resist protective oxide (RPO) over a third portion of the n-type drift region between the gate structure and the drain structure, etching a field plate contact opening to expose a surface portion of the resist protective oxide, and depositing a field plate contact in the field plate contact opening for providing a direct electrical connection to the resist protective oxide.

Other embodiments of the methods of manufacturing include additional or modified operations including forming a drain contact for providing a direct electrical connection to the drain structure, forming a metal jumper between the field plate contact and the drain contact, forming the resist protective oxide (RPO) over a portion of the gate structure, forming sidewall structures adjacent the gate structure, defining a plurality of active areas on the P-type substrate, forming field oxide (FOX) structures between adjacent active areas, positioning the field plate contact closer to the drain structure than to the gate structure, positioning the field plate contact on the resist protective oxide (RPO) at an offset from the gate structure of between 40% and 70% of the Lds, positioning the field plate contact on the resist protective oxide (RPO) at a contact point that is separated from the gate structure by between 40% and 70% of the Lds, and/or forming a plurality of field plate contacts on the resist protective oxide (RPO) with the field plate contact offset from the gate structure by at least 40% of the Lds.

Methods of improving LDMOS performance according to some embodiments include the operations of depositing an insulating field plate over a portion of an n-type drift region arranged between a gate structure and a drain structure and applying a field plate voltage to the field plate during device operation, applying a field plate voltage of at least 14V, and/or applying a field plate voltage that is equal to a drain voltage (Vdd) that is applied to the drain of the LDMOS integrated circuit device during device operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit comprising:
   a gate structure;
   a drain structure, wherein the gate structure and the drain structure are separated by a drift region length (Lds);
   a resist protective oxide (RPO) between the gate structure and the drain structure;
   a field plate contact in direct electrical connection with the resist protective oxide;
   a drain structure contact in direct electrical connection with the drain structure, wherein the drain structure contact and the field plate contact are separated by a dielectric material; and
   a conductive pattern in electrical contact with both the field plate contact and the drain structure contact.

2. The integrated circuit according to claim 1, wherein:
   the conductive pattern in electrical contact between the drain structure contact and the field plate contact wherein an applied voltage will be the drain voltage.

3. The integrated circuit according to claim 2, wherein:
   the field plate contact is separated from the gate structure by a first distance (D1), with the first distance being at least 35% of the Lds.

4. The integrated circuit according to claim 3, wherein:
   the first distance is between 40% and 70% of the Lds.

5. The integrated circuit according to claim 1, wherein:
   the field plate contact has a contact width (D3), and
   the contact width is between 10% and 30% of the Lds.

6. The integrated circuit according to claim 1, wherein:
   the field plate contact comprises a first field plate contact having a first contact width and a second field plate contact having a second contact width,
   the first contact width is at least 10% of the Lds, and
   the second contact width is at least 10% of the Lds.

7. The integrated circuit according to claim 1, wherein:
   the resist protective oxide has an RPO thickness (D2), and
   the RPO thickness is at least 10% of the Lds.

8. The integrated circuit according to claim 1, wherein:
the resist protective oxide has an RPO thickness (D2); and
wherein the RPO thickness is between 0.05 μm and 0.2 μm.

9. The integrated circuit according to claim 1, wherein: the Lds is at least 0.5 μm.

10. A method of manufacturing an integrated circuit comprising:
forming a gate structure;
forming a drain structure, wherein the gate structure and the drain structure are separated by a drift region length (Lds);
forming a resist protective oxide (RPO) structure between the gate structure and the drain structure;
forming a field plate contact in direct electrical connection to the resist protective oxide structure;
forming a drain structure contact in direct electrical connection with the drain structure, wherein the drain structure contact and the field plate contact are separated by a dielectric region; and
forming a conductive pattern over the dielectric region, wherein the conductive pattern electrically connects the drain structure contact and the field plate contact.

11. The method according to claim 10, further comprising:
forming a sidewall structure adjacent the gate structure; and
forming a portion of the resist protective oxide (RPO) structure adjacent the sidewall structure.

12. The method of claim 11, further comprising:
extending the resist protective oxide (RPO) structure over the sidewall structure and an upper portion of the gate structure.

13. The method of claim 10, further comprising:
extending the resist protective oxide (RPO) structure over an upper portion of the gate structure.

14. The method of claim 10, further comprising:
defining a plurality of active areas on the P-type substrate;
forming field oxide (FOX) structures between adjacent active areas; and
positioning the field plate contact closer to the drain structure than to the gate structure.

15. The method according to claim 10, further comprising:
positioning the field plate contact on the resist protective oxide (RPO) at an offset from the gate structure of between 40% and 70% of the Lds.

16. The method according to claim 10, further comprising:
positioning the field plate contact on the resist protective oxide (RPO) at a contact point that is separated from the gate structure by between 40% and 70% of the Lds.

17. The method according to claim 10, further comprising:
forming a plurality of field plate contacts on the resist protective oxide (RPO) with the field plate contact offset from the gate structure by at least 40% of the Lds.

18. A method of improving high-voltage performance in a LDMOS integrated circuit comprising:
depositing an insulating field plate over a portion of an n-type drift region;
forming a drain structure between the insulating field plate and an isolation region;
forming conductive jumper between the insulating field plate and the drain structure; and
applying a field plate voltage to the conductive jumper during device operation.

19. The method according to claim 18, wherein:
the applied field plate voltage is at least 14V.

20. The method according to claim 18, wherein:
the applied field plate voltage is a drain voltage (Vdd).

* * * * *